United States Patent [19]

Hayashi et al.

[11] Patent Number: 5,045,497

[45] Date of Patent: Sep. 3, 1991

[54] METHOD OF MAKING A SCHOTTKY ELECTRODE

[75] Inventors: Kazuo Hayashi; Takuji Sonoda, both of Itami, Japan

[73] Assignee: Mitsubishi Denki Kabushiki Kaisha, Japan

[21] Appl. No.: 426,183

[22] Filed: Oct. 25, 1989

Related U.S. Application Data

[62] Division of Ser. No. 139,738, Dec. 30, 1987, abandoned.

[30] Foreign Application Priority Data

Jan. 19, 1987 [JP] Japan .................................. 62-11004

[51] Int. Cl.$^5$ ............................................ H01L 21/44
[52] U.S. Cl. ..................................... 437/175; 437/177;
  437/176; 437/197; 437/196; 437/912; 437/911;
  437/957; 148/DIG. 139; 148/DIg. 140;
  148/DIG. 88
[58] Field of Search ............... 437/177, 911, 912, 197,
  437/957, 175; 148/DIG. 139, DIG. 140, DIG.
  13, DIG. 88

[56] References Cited

U.S. PATENT DOCUMENTS

| | | | |
|---|---|---|---|
| 3,231,421 | 7/1966 | Schmidt | 437/197 |
| 3,935,586 | 1/1976 | Landheer et al. | 437/177 |
| 4,154,874 | 5/1979 | Howard et al. | 437/197 |
| 4,310,568 | 1/1982 | Howard et al. | 437/175 |

FOREIGN PATENT DOCUMENTS

0026973 10/1972 Japan .................................. 437/197

OTHER PUBLICATIONS

"Initial Phase Formation and Dissociation in the Thin-Film Ni/Al System", E. G. Colgan et al., J. Appl. Phys. 58(11), 1985, pp. 4125–4129.

"Fabrication of Intermetallic Diffusion Barriers for Electromigration in Narrow-Line Stripes", Howard et al., IBM Tech. Disclosure Bulletin, 2/78, pp. 3477–3479.

"Correlation of Schottky-Barrier Height and Microstructure in the Epi-Ni Silicide on Si(111)", Liehr et al., Phys. Review Letters, 5/85, pp. 2139–2142.

Primary Examiner—Brian E. Hearn
Assistant Examiner—Trung Dang
Attorney, Agent, or Firm—Leydig, Voit & Mayer

[57] ABSTRACT

A semiconductor device includes a semiconductor body and a metal contact forming a Schottky barrier with said body, the metal contact including a layer of nickel disposed on the semiconductor body, an aluminum layer disposed on the nickel layer, and a nickel aluminum alloy disposed at the interface of the layers. The alloy is formed by heating the metal layers.

2 Claims, 3 Drawing Sheets

METHOD OF MAKING A SCHOTTKY ELECTRODE

This application is a division of application Ser. No. 07/139,738, filed Dec. 30, 1987 now abandoned.

FIELD OF THE INVENTION

The present invention relates to a semiconductor device and, more particularly, to a device incorporating a Schottky barrier junction.

BACKGROUND ART

Many semiconductor devices employing Schottky barrier junctions, such as junction type field effect transistors, including GaAs field effect transistors (GaAs FET) and high electron mobility transistors (HEMT), are known.

FIG. 2 shows an example of a field effect transistor. In FIG. 2, a semiconductor body 1, comprising n type GaAs, is the active region of a field effect transistor. In a HEMT, layer 1 may comprise several layers of n-AlGaAs/GaAs or n-GaAs/n-AlGaAs/GaAs. Gate electrodes 2 comprising aluminum layers 22 form Schottky barrier junctions with surfaces of the semiconductor body 1. Depletion layers 3 may obstruct a current flowing from the source electrode 4 to the drain electrode 5. The thickness of this depletion layer 4 is controlled by the voltage applied to the gate electrode 2. $V_D$ designates a power supply connected between the source electrode 4 and the drain electrode 5. $V_G$ designates a control power supply connected between the source electrode 4 and the gate electrode 2.

In the prior art semiconductor device of such a construction, aluminum layers 22 are generally used as gate electrodes 2 for the following reasons.

(a) The low resistivity of the aluminum layer 22 reduces the gate parasitic resistance (Rg) which adversely affects the performance of the field effect transistor.

(b) The aluminum layer 22 can be produced relatively easily.

There are, however, the following drawbacks in the gate electrodes 2 using aluminum layers 22.

(1) The pure aluminum layer 22 is likely to undergo stress migration or electro-migration, and, therefore, voids are likely to be produced at the gate electrode 2 due to thermal stresses and electric stresses. As a result, an undersirable phenomenon called a non-pinchoff is likely to arise.

(2) The aluminum layer 22 does not adhere well to semiconductor body 1 and it is difficult to obtain good Schottky barrier characteristics.

In order to overcome the disadvantages of the gate electrodes 2 using aluminum layers 22, a gate electrode 2 using a gold (Au) layer which has good resistance to stresses can be conceived. However, a Au layer has no thermal stability as a Schottky electrode and reacts with the semiconductor body 1, destroying the rectifying characteristics of the barrier and its usefulness in a field effect transistor.

To solve the above-described problems, a device in which gate electrode 2 includes multiple metal layers as shown in FIG. 3 has been conceived. In FIG. 3, the same reference numerals designate the same elements as those shown in FIG. 2. In FIG. 3, a titanium layer 23 forms a Schottky barrier junction with the main surface of the semiconductor body 1. A platinum layer 24 is disposed on the upper surface of the titanium layer 23. A gold layer 25 is disposed on the upper surface of the platinum layer 24 for reducing the gate parasitic resistance (Rg) and resisting stresses. In this case, the intrusion of Au atoms from layer 25 into the semiconductor body 1 is prevented by the platinum layer 24. In a device in which the gate electrode 2 comprises titanium layer 23, platinum layer 24, and Au layer 25, gold is deposited not only on layer 24 but also on the sides of layers 23 and 24 as shown in FIG. 4. Au layer 25 comes in direct contact with the semiconductor body 1 and reacts with it, thereby producing a non-rectifying contact and destroying field effect transistor action. Furthermore, platinum for layer 24 is difficult to evaporate due to its low vapor pressure, making production quite difficult.

In the above-described prior art semiconductor devices, has been impossible to realize a semiconductor device having a gate electrode 2 with a small gate parasitic resistance (Rg) and good adhesion to semiconductor body 1 that is resistant to stress and easy to produce.

SUMMARY OF THE INVENTION

An object of the present invention is to provide an improved semiconductor device which is quite stable against thermal and electrical stresses, easy to produce, and of high reliability.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to the present invention, a metal contact comprises a nickel layer that forms a Schottky barrier with the main surface of a semiconductor body, an aluminum layer disposed on the nickel layer, and a nickel-aluminum alloy layer therebetween that is easily formed in a relatively low temperature thermal process. Thus, a semiconductor device having superior Schottky barrier characteristics that is resistant to thermal and electrical stresses, of high stability, and high reliability is obtained.

DETAILED DESCRIPTION OF THE PREFERRED EMBODIMENTS

Figure 1:
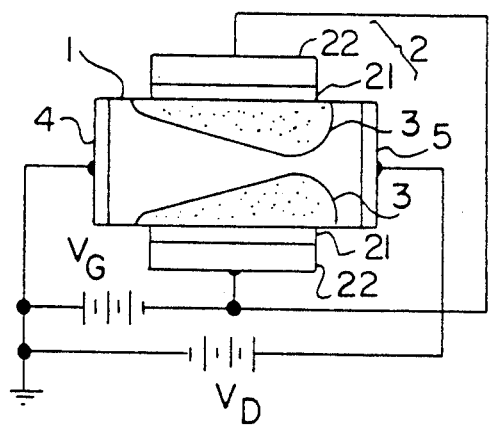
FIG. 1 is a cross-sectional view showing a semiconductor device according to an embodiment of the present invention.
Figure 2:
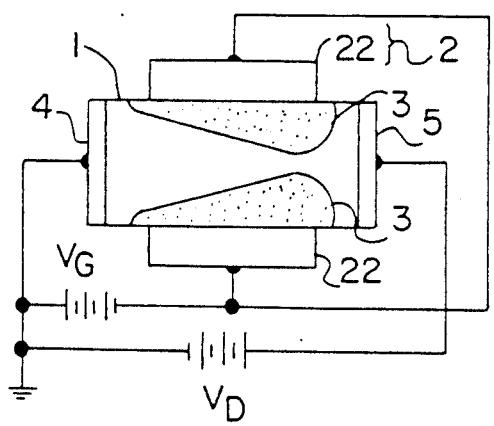
FIG. 2 is a cross-sectional view showing a prior art semiconductor device.
Figure 3:
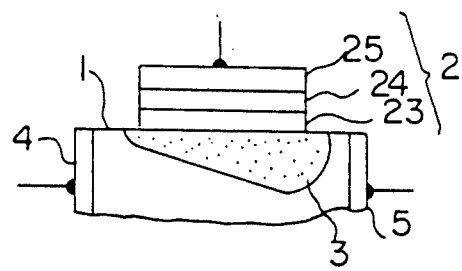
FIGS. 3 and 4 are cross-sectional views showing another prior art semiconductor device.
Figure 4:
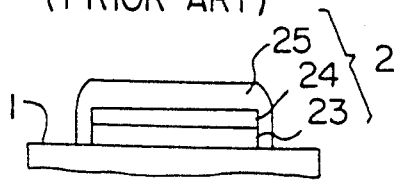

In FIG. 1, the same reference numerals as those used in the prior art devices designate the same or corresponding elements. A nickel layer 21 forming a Schottky barrier with the main surfaces of the semiconductor body 1 is deposited by a conventional process, such as a vacuum evaporation method. An aluminum layer 22 is directly deposited on the nickel layer 21 by a similar process. The aluminum layer 22 and the nickel layer 21 comprise a gate electrode 2. A nickel aluminum alloy layer is produced at the junction between the aluminum layer and the nickel layer in a thermal process.

In the semiconductor device having a gate electrode 2 of such a construction, the nickel layer 21 can be evaporated easily. The device can function as a field effect transistor because the nickel layer 21 forms a good Schottky barrier with the semiconductor active layer 1. Furthermore, as a nickel aluminum alloy layer is formed between the nickel layer 21 and the aluminum layer 22 in a thermal process, gate electrode 2 is resistant to thermal and electric stresses. That is, in the present invention, a semiconductor device is produced that overcomes the disadvantages of the aluminum layer 22 by providing a nickel layer 21 between the aluminum layer 22 and the semiconductor body 1.

Figure 5A:
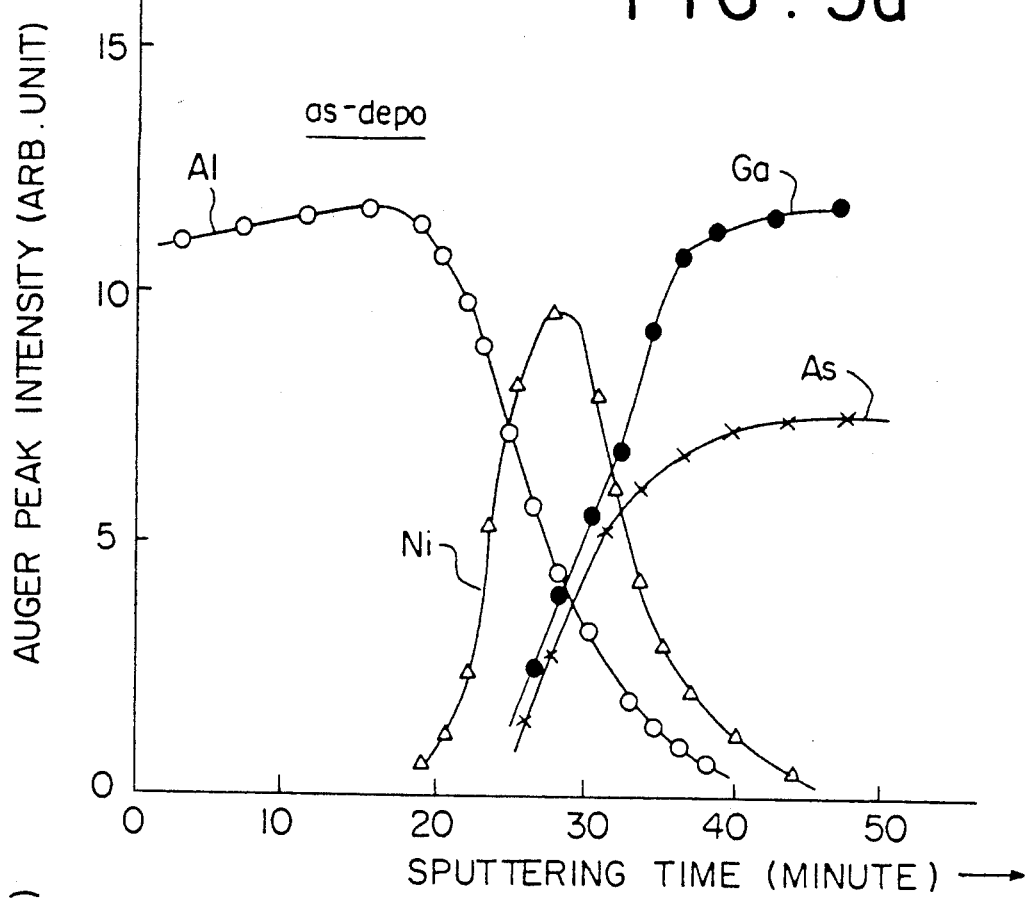
FIGS. 5(a) and 5(b) are graphs showing relative metal concentration depth profiles obtained by Auger analysis before and after thermal processing of a semiconductor device according to the embodiment of FIG. 1.
Figure 5B:
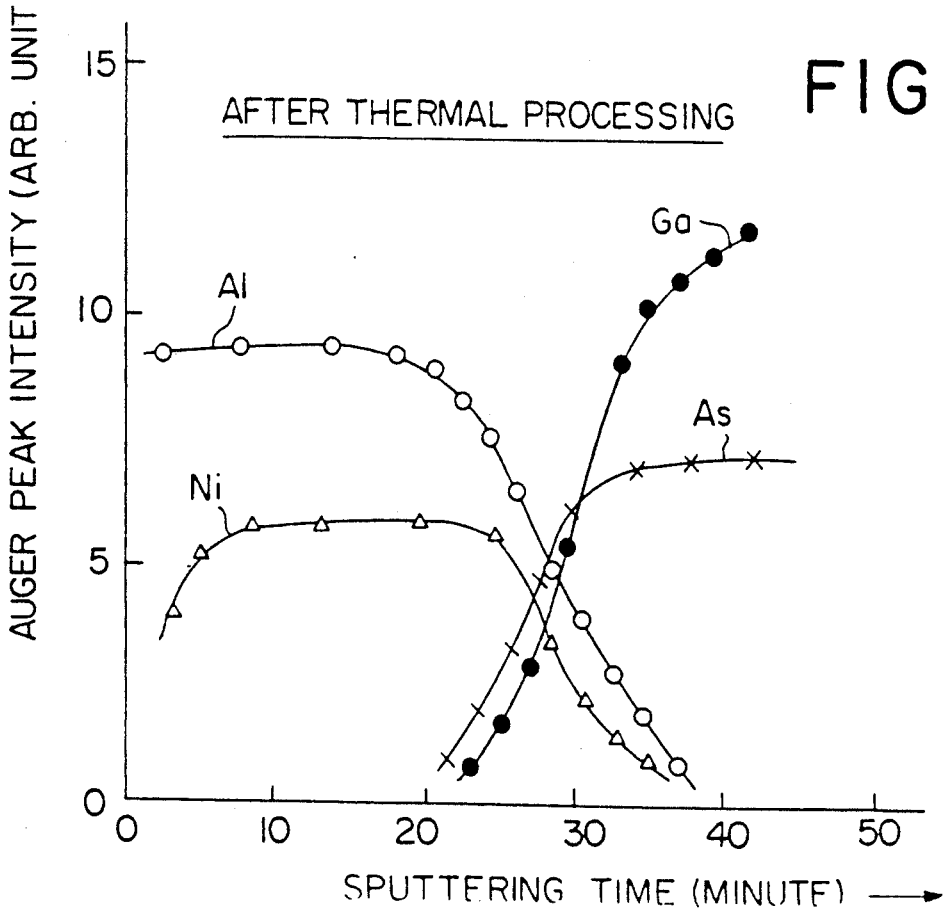

The inventors have conducted an Auger analysis before (designated "as-depo") and after thermal processing for about 10 minutes at 250° C. to 300° C. of the gate shown in FIG. 1 and obtained the results shown in FIGS. 5(a) and 5(b), respectively. As is apparent from FIGS. 5(a) and 5(b), a nickel-aluminum alloy layer, which is resistant to thermal and electrical stresses, is easily formed by the reaction between the nickel layer 21 and the aluminum layer 22.

The inventors have found that the thickness of the nickel layer 21 required to produce a nickel aluminum alloy layer which is resistant to thermal and electrical stresses should be larger than 10 Å and that when the thickness of the nickel layer 21 is larger than 10 Å and smaller than 100 Å, it is possible to obtain a gate reverse breakdown voltage 2 to 4 V higher than that of a gate electrode 2 using only pure aluminum. Therefore, the device is stable and does not suffer from non-pinchoff even when it is subjected to high temperatures for over 1,000 hours.

Figure 6:
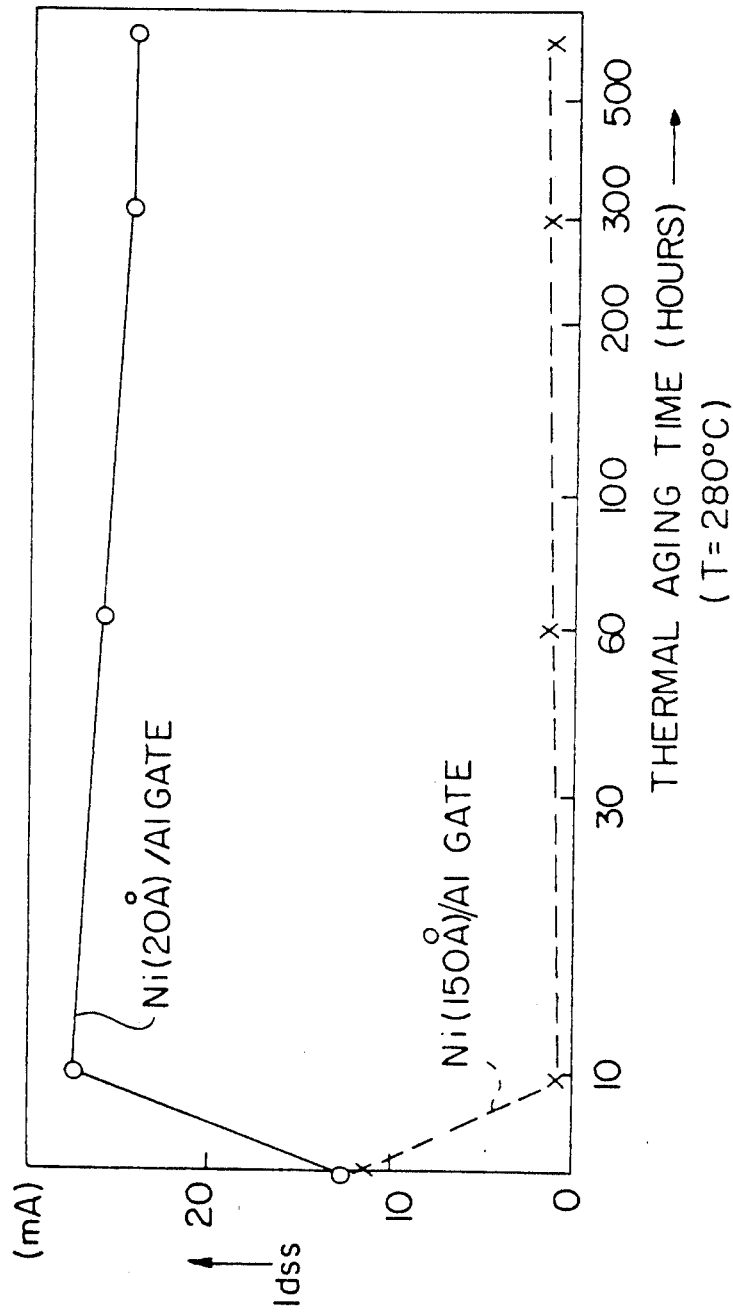
FIG. 6 is a graph showing drain current Idss versus time, i.e, thermal aging characteristics, of semiconductor devices having the structure of the embodiment of FIG. 1 both according to and not according to the invention.

FIG. 6 shows the time variation of the saturated drain current Idss of an HEMT maintained at a high temperature and having a nickel layer 21 that is 20 Å thick. In addition, FIG. 6 shows an example in which the thickness of the nickel layer is larger than 100 Å, i.e., 150 Å. The HEMT with the 20 Å nickel layer shows excellent stability, while a drastic decrease of the saturated drain current Idss in the HEMT with the 150 Å nickel layer is observed, even during brief thermal processing.

As is apparent from the results of FIG. 6, it is possible to obtain superior characteristics when the thickness of the nickel layer 21 is larger than 10 Å and smaller than 100 Å.

The above-illustrated embodiment is described as a junction type field effect transistor, but the present invention may be applied to a metal contact in a Schottky diode where the metal contact may comprise a nickel layer and an aluminum layer with the same effects as described above.

We claim:

1. A method of producing a Schottky barrier in a semiconductor device comprising:

depositing a nickel layer having a thickness less than 100 Angstroms on a surface of a semiconductor substrate;

depositing an aluminum layer on said nickel layer opposite the substrate; and heating the nickel and aluminum layers to a temperature between 250° and 350° C. for about ten minutes to form a nickel aluminum alloy at said surface.

2. The method of claim 1 including depositing said nickel layer to a thickness greater than 10 Å.

* * * * *